United States Patent [19]

Martini

[11] Patent Number: 5,759,273
[45] Date of Patent: Jun. 2, 1998

[54] CROSS-SECTION SAMPLE STAINING TOOL

[75] Inventor: Frank E. Martini, Boise, Id.

[73] Assignee: Micron Technology, Inc., Boise, Id.

[21] Appl. No.: 680,907

[22] Filed: Jul. 16, 1996

[51] Int. Cl.$^6$ ..................................................... B05C 3/00
[52] U.S. Cl. .......................... 118/407; 118/428; 118/500; 118/503
[58] Field of Search ........................ 118/407, 428, 118/500, 503

[56] References Cited

U.S. PATENT DOCUMENTS

| | | | |
|---|---|---|---|
| 4,199,613 | 4/1980 | Johnson | 118/503 |
| 4,960,224 | 10/1990 | Boenisch | 118/428 |
| 5,131,546 | 7/1992 | Kodera | 118/500 |

FOREIGN PATENT DOCUMENTS

| | | | |
|---|---|---|---|
| 0125975 | 9/1979 | Japan | 118/500 |
| 0144515 | 6/1988 | Japan | 118/500 |
| 2079422 | 3/1990 | Japan | 118/407 |

*Primary Examiner*—Laura Edwards
*Attorney, Agent, or Firm*—Kirkpatrick & Lockhart LLP

[57] ABSTRACT

An apparatus and method is disclosed for contacting samples with liquids. The apparatus includes a slotted support member positionable with respect to a container to allow a sample retained within the slot to be contacted by chemicals within the container. The slot in the support member is defined by opposing faces that are outwardly biasable and extend from a base. Preferably, three support members are spaced parallel to each other. The slots in the three support members are preferably aligned in parallel planes to allow larger wafer samples to be retained within the slots on more than one support member. A handle is preferably attached perpendicular to and bisecting each support member. Two bending rods are preferably disposed on opposite sides of the handle perpendicular to the support members. The bending bars are positioned to allow the support members to bent over the bars thereby outwardly biasing the opposing faces and opening the slots to receive the samples.

18 Claims, 2 Drawing Sheets

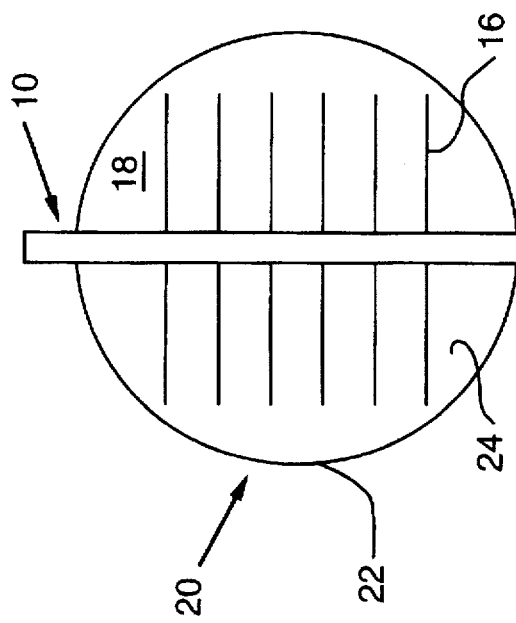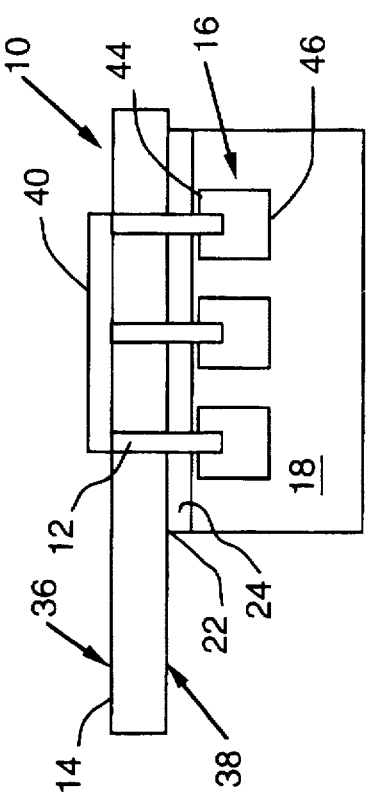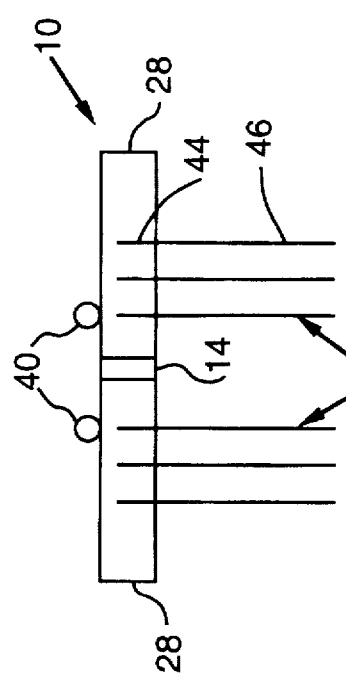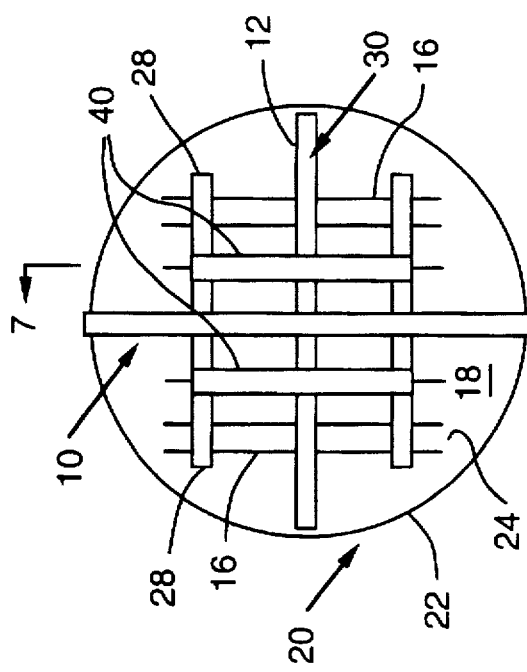

CROSS-SECTION SAMPLE STAINING TOOL

BACKGROUND OF THE INVENTION

1. Field of the Invention

The present invention generally relates to a sample preparation tool and methods for using the tool. More particularly, the present invention relates to tools and methods for holding multiple semiconductor wafer samples that are to be stained with treatment chemicals prior to microanalysis, such as scanning electron microscopy, to allow simultaneous sample preparation.

2. Description of the Invention Background

Integrated circuits are typically constructed by depositing a series of individual layers of predetermined materials on a wafer shaped semiconductor substrate, or "wafer". The individual layers of the integrated circuit are in turn produced by a series of manufacturing steps. The performance characteristics of the circuits are dependent upon the ability to consistently produce the layers not only from wafer to wafer, but from circuit to circuit on each wafer. The maintenance of tight manufacturing tolerances requires that strict quality control procedures be in place, including frequent sampling of the wafers for process characterization. Because of the numerous processing steps involved in the production of semiconductor devices, a significant number of samples must be processed as part of a quality control program. The layers of the wafer are characterized by surface morphology, chemical composition and crystal structure to provide detailed information of the quality of the layers and the processes used to produce the layers. It is desirable to analyze the samples as close to real time as possible to allow for an out of control process line to be detected and corrected as soon as possible. Various microanalytic techniques are employed, such as optical, scanning electron (SEM) and transmission electron (TEM) microscopy to determine the morphology of the layers. The characteristic dimensions of the layers are often a few microns or less, which are well within the capabilities of the analytic tools; however, the results of analyses performed on such short length scales can be highly affected by the preparation techniques used on the samples. Variations in the preparation techniques can produce erroneous indications of product quality and process control problems. In addition, the amount of time necessary to prepare the sample significantly increases the time before an out of control process is detected.

One such example of a technique that is afflicted with the aforementioned problems is in the preparation of samples for SEM analysis. In order to perform the SEM analysis, the wafers must be sectioned to form samples and treated with staining chemicals, such as acids. The current practice in the semiconductor industry is to prepare the samples individually by first placing the sample in the staining chemicals using tweezers. After a predetermined period of time, the sample is removed from the staining chemicals using the tweezers and the sample is rinsed to remove excess staining chemicals and then dried. In many SEM preparation techniques, the samples are exposed to multiple staining chemicals to achieve the desired characteristics and the above procedure must be performed for each staining procedure and for every sample. Obviously, this procedure is very time consuming and can also produce scatter in the test results for a given sample lot due to variations in many factors, such as exposure time and the varying strength of staining chemicals. As such, it would be highly desirable to develop an apparatus and a method to stain wafer samples in a cost effective and timely manner that also tends to minimize the sample to sample variation introduced by the staining process to allow more timely and accurate quality control data to be obtained.

The present invention is directed to an apparatus and method for which overcomes, among others, the above-discussed problems so as to provide an apparatus and a method to uniformly stain a sample lot in a timely manner.

SUMMARY OF THE INVENTION

The above objects and others are accomplished by methods and apparatuses in accordance with the present invention. The apparatus includes at least one slotted support member positionable with respect to a container to allow a sample retained within the slot to be contacted by chemicals within the container. A handle which may be attached to or integral with the support member. The number of slots in the support member correspond to at least the number of wafer samples that are to be retained in the slots. Preferably, three support members are spaced parallel to each other and the slots in all three support members are aligned in parallel planes so that larger wafer samples can be seated within the slots on more than one support member and the handle is attached perpendicular to and bisects each member. Also two bending rods are disposed on opposite sides of the handle perpendicular to the support members for bending the support members to open the slots to receive the wafer samples. It is also preferred that the apparatus be formed from a hard plastic material, such as fire resistant polypropylene, or any other material that is sufficiently resistant to the staining chemicals and that can be machined to incorporate slots suitable to receive and retain the wafer samples without crushing the samples.

In the practice of the invention, the wafer is sectioned into the number of samples required by the testing procedure. The samples are inserted into the slots in the support member, which retain the samples, which can then be simultaneously prepared for testing. The apparatus can be used during treatment and transportation of the samples in the various steps of sample preparation necessary prior to performing SEM on the samples.

Accordingly, the present invention provides an apparatus and method for staining semiconductor wafer samples that allows for more uniform staining of the sample lot and significant shortening of the material preparation time for the analysis by allowing the simultaneous preparation of multiple samples. These and other details, objects, and advantages of the invention will become apparent as the following detailed description of a present preferred embodiment thereof proceeds.

BRIEF DESCRIPTION OF THE DRAWINGS

Preferred embodiments of the present invention will be described in greater detail with reference to the accompanying drawings, wherein like members bear like reference numerals and wherein:

FIG. 5 is a back side view of a preferred embodiment of the present invention retaining six samples;

FIG. 6 is a top plan view of an alternative preferred embodiment supported only by the handle on a container containing the staining chemicals;

FIG. 7 is a side cross sectional view of a preferred embodiment of the present invention along line 7—7; and, FIG. 8 is a top plan view of an alternative preferred embodiment in which the handle and a single support member are an integral elongated member which is seated on a container containing staining chemicals and supporting six samples.

DETAILED DESCRIPTION OF PREFERRED EMBODIMENTS

Figure 2:
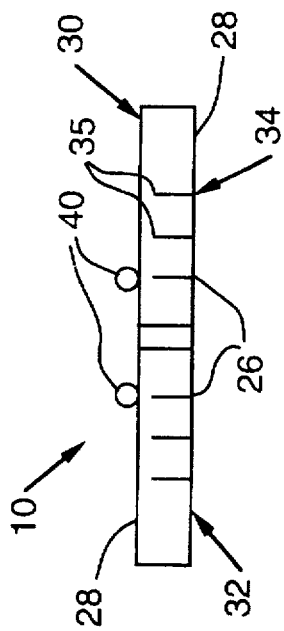
FIG. 2 is a front view of a preferred embodiment of the present invention in direction 2—2.

The operation of the apparatus 10 will be described generally with reference to the drawings for the purpose of illustrating present preferred embodiments of the invention only and not for purposes of limiting the same. The apparatus 10 of the present invention is used to retain multiple wafer samples 16 to allow for simultaneous preparation of the samples for various analysis techniques, such as SEM. The apparatus 10 includes at least one slotted support member 12 and a handle 14, which is attached to, or alternatively, integral with the support member 12. In one step of SEM processing, the apparatus 10 is used to expose multiple wafer samples 16 to staining chemicals 18 contained in a container 20 having an open end 24 defined by a rim 22.

Figure 1:
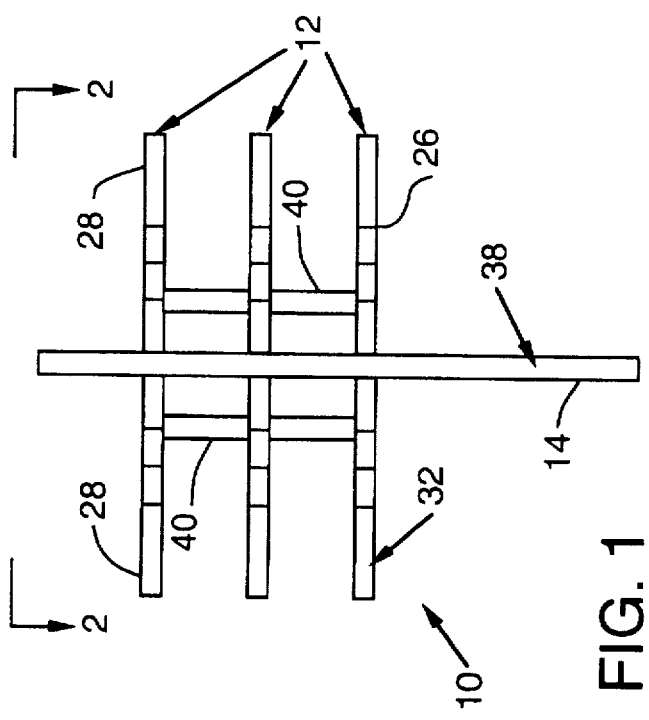
FIG. 1 is a bottom plan view of a preferred embodiment of the present invention showing the slots in the support members.
Figure 3:
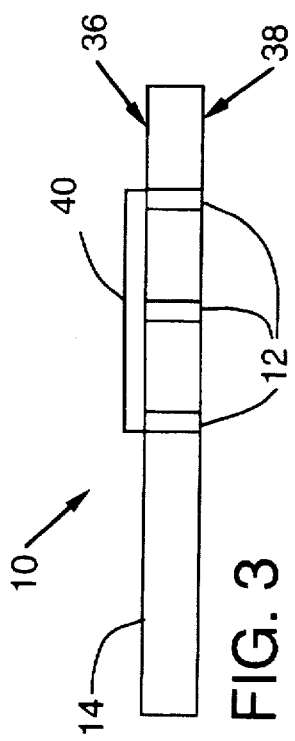
FIG. 3 is a side view of a preferred embodiment of the present invention.

The support members 12 are preferably elongated members containing slots 26, and having opposing ends 28 connected by a longitudinal axis and top and bottom surfaces, 30 and 32, respectively. The slots 26 are defined by opposing faces 34 and a base 35 in the bottom surface 32 perpendicular to the longitudinal axis of the support member 12 and are sized to receive and retain the sample 16 by the clamping action of the opposing faces 34. The number of slots 26 in the support member 12 corresponds to at least the number of samples to be retained in the slots. In a preferred embodiment, three support members 12 are used to support the samples 16. The longitudinal axes of the support members 12 are aligned parallel to each other and the slots 26 in the support members 12 are preferably aligned in parallel planes such that larger samples 16 can be retained in the slots 26 of all three support members 12 simultaneously. A staggered arrangement of the slots 26 between the support members 12 may also be useful for retaining different sized samples. Also in a preferred embodiment, the support members 12 are identical members as shown in FIG. 1, and have a length in the direction of the longitudinal axis that is greater than the dimensions of the rim 22 of the container 20 so that the support members 12 will be seated on the rim 22 when a portion of the samples 16 are placed into the staining chemicals 18. Persons skilled in the art will appreciate that the number of support members 12 and the number and arrangement of the slots 26 can be modified to suit a specific application.

The handle 14 is also preferably an elongated member having top and bottom surfaces, 36 and 38. The handle 14 extends through the support members 12 perpendicular to the longitudinal axes and the bottom surface 38 is in a common plane with the bottom surfaces 32 of the support member 12. In a preferred embodiment, the handle 14 has an elongated length that is greater than the dimensions of the rim 22 of the container 20 so that the handle 14 will be seated on the rim 22 when the samples 16 are placed into the staining chemicals 18. The handle 14 can be further provided with notches (not shown) in the bottom surface 38 that can mate with the rim 22 of the container 20 to prevent sliding of the apparatus 10. The notches can also be provided in the bottom surfaces 32 of the support member 12 to further prevent sliding of the apparatus 10 on the container 20.

Figure 4:
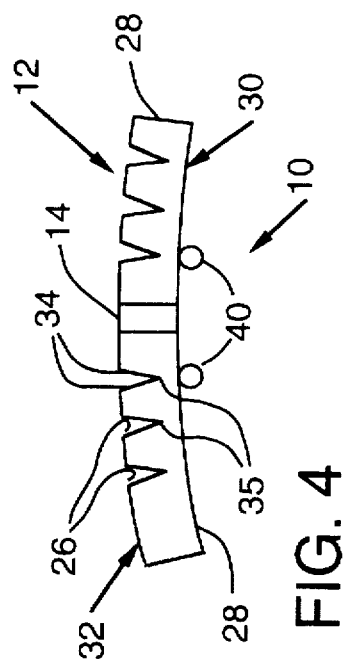
FIG. 4 is a front view of a preferred embodiment of the present invention with the support members being bent over the bending rods to open the slots to receive the wafer samples.

In a preferred embodiment, two bending rods 40 are attached to the top surface 30 of the support members 12 perpendicular to the longitudinal axis of the support members 12. One bending rod 40 is disposed on each side of the handle 14 and the bending rods 40 are preferably attached directly opposite one of the slots 26 on the support members 12. A force can be applied to the opposing ends 28 of the support member 12 to bend the support members 12 around the bending rods 40. The applied force outwardly biases the opposing faces 34 about the base 35 to separate the opposing faces 34 from a rest position, thereby opening the slots 26 to receive the samples 16, as shown in FIG. 4. After the samples 16 have been inserted in the slots 26, the force is released from the support member 12 and the opposing faces 34 of the slots 26 attempt to return to the rest position. However, the presence of the samples 16 prevents the relaxing of the opposing faces 34 back to the rest position and the opposing faces 34 exert opposing forces on the samples 16 that are sufficient to retain the samples 16 in the support member 12.

In a preferred embodiment, the support members 12, the handle 14 and the bending rods 40 are constructed from fire resistant polypropylene to provide sufficient rigidity and durability to the apparatus 10. The fire resistant polypropylene has been found to be more resilient than standard polypropylene after repeated applications of the force necessary to open the slots 26 to insert and remove the samples 16 from the support members 12. Other materials having sufficient rigidity could also be used in the apparatus 10, such as Teflon, polytetrafluoroethylenes and other plastics, as well as metals; however, because the samples 16 are being held by the forces exerted by the opposing faces 34 of the support member 12, it is desirable to use a material for the support members 12 that is sufficiently rigid, but softer than the samples 16 to minimize damage to the samples 16. While the preferred embodiment has been described with the support member 12, the handle 14, and the bending rods 40 being separate components attached to each other, one skilled in the art will appreciate that all components can be integrally formed as one piece or that various combinations of the components can be formed as single pieces.

Alternatively, as shown in FIGS. 6 and 7, the handle 14 can be attached to the support members 12 such that the bottom surface 38 of the handle 14 is not in a common plane with the bottom surface 32 of the support members 12. In this embodiment, if the length of the support members 12 is less than the dimensions of the rim 22, the support members 12 can be lowered in the container 20, while the handle 14 is seated on the rim 22, thereby allowing for a greater portion of the sample 40 to be placed into the staining chemicals 18, as shown in FIG. 6. In this embodiment, as well as in other embodiments, additional handles 14 may be added to impart additional stability to the apparatus 10 as it is seated upon the container 20 or to provide flexibility in handling the apparatus 10 as may be necessary depending upon the size of the apparatus 10.

In another embodiment shown in FIG. 8, the handle 14 and the support member 12 are integral and constitute a single elongated member 42 containing slots 26 to receive and retain the samples 16. In this embodiment, the samples 16 are supported perpendicular to the elongated member 42 and the elongated member 42 is seated upon the rim 22 when the samples 16 are placed into the staining chemicals 18.

In the practice of the invention, a wafer is sectioned to produce the wafer samples 16. A force is applied to the bottom surface 32 at ends 28 of the support members 12 to bend the support members 12 around the bending rods 40 to open the slots 26 to receive the wafer samples 16, as in FIG. 4. The wafer samples 16 are inserted into the slots 26 and the force is released from the opposing ends 28. The opposing forces exerted on the samples 16 by the opposing faces 34 clamps the samples 16 in the support members 12, as shown in FIG. 5. The clamped samples 16 have a retained portion 44 and a free portion 46. In practice, the portion that is to be the site to undergo SEM analysis should be the free portion 46, so as to reduce the possibility of damage to the analysis site. The apparatus 10 is then positioned with the handle 14 seated on the container 20, as generally illustrated in FIG. 6, such that the free portion 46 of the samples 16 extends into the staining chemicals 18. The samples 16 are exposed to the staining chemicals 18 for a predetermined period of time after which the samples are removed from the staining chemicals 18. The samples 16 can then be rinsed to remove the excess staining chemicals 18 and dried. The apparatus 10 can then be used to expose the samples 16 to additional treatment chemicals and the above outlined procedure can be repeated, if necessary. Following the final staining procedure, a force is again applied to the bottom surface 32 at opposing ends 28 of the support member 12 to bend the support members 12 around the bending rods 40 to open the slots 26 and the samples 16 can be removed and other samples may be inserted into the slots 26.

Those of ordinary skill in the art will appreciate that the present invention provides significant advantages over the current practice of individually staining, rinsing and drying the samples. In particular, the subject invention not only allows a large number of samples to be prepared at one time, it also ensures that the samples are exposed to the same chemicals solution for the same period of time. In addition, the subject invention provides the additional benefit of minimizing the handling of the sample that also provides for a higher quality sample for examination and less exposure of personnel to potentially hazardous preparation chemicals. While the subject invention provides these and other advantages over prior art, it will be understood, however, that various changes in the details, materials and arrangements of parts and steps which have been herein described and illustrated in order to explain the nature of the invention may be made by those skilled in the art within the principle and scope of the invention as expressed in the appended claims.

What is claimed is:

1. An apparatus for contacting at least one sample with staining chemicals comprising:
    a container having an open end and an interior for retaining staining chemicals;
    at least one support member containing at least one slot having opposing faces outwardly biasable about a base and configured to retain a sample therein, wherein said at least one support member is positionable to contact the sample with staining chemicals in said interior of said container; and,
    at least one bending bar attached to said at least one support member to allow said opposing faces to become outwardly biased about said base when said support member is bent around said at least one bending bar.

2. The apparatus of claim 1 wherein one of said at least one support member includes an integral handle.

3. The apparatus of claim 2 wherein:
    said open end is defined by a rim; and,
    said handle is seatable upon said rim.

4. The apparatus of claim 1 wherein said at least one support member comprises a plurality of support members.

5. The apparatus of claim 4 wherein:
    said open end is defined by a rim; and,
    said plurality of support members are seatable upon said rim.

6. The apparatus of claim 1, further comprising a handle attached to said at least one support member.

7. The apparatus of claim 1, further comprising a handle attached to said at least one support member, wherein said handle is seatable upon said container with said at least one support member disposed within said interior of said container.

8. The apparatus of claim 1, further comprising a handle attached substantially perpendicular to said at least one support member opposite to said at least one slot.

9. The apparatus of claim 8, wherein said at least one support member include a plurality of substantially parallel spaced support members containing a plurality of slots substantially parallel to said handle.

10. The apparatus of claim 1, wherein said at least one bending bar includes a plurality of bending bars.

11. The apparatus of claim 1, wherein said at least one bending bar includes a two substantially parallel spaced bending bars attached to said at least one support member parallel to and opposite said at least one slot.

12. The apparatus of claim 11, further comprising a handle attached to said at least one support member substantially parallel to and between said two bending bars.

13. The apparatus of claim 12, wherein:
    said at least one support member include a plurality of substantially parallel spaced support members containing a plurality of slots parallel to said handle.

14. The apparatus of claim 1, wherein:
    said open end is defined by a rim; and,
    said at least one support member is seatable upon said rim.

15. The apparatus of claim 1, wherein said at least one support member includes a plurality of substantially parallel spaced support members containing a plurality of substantially parallel slots.

16. The apparatus of claim 1, wherein said at least one support member includes a plurality of substantially parallel spaced support members containing a plurality of substantially parallel slots that are substantially perpendicular to said plurality of said support members.

17. The apparatus of claim 1, wherein said at least one support member is comprised of a material selected from the group consisting of polypropylenes, polytetrafluoroethylenes, metals, and combinations thereof.

18. The apparatus of claim 1, wherein said at least one support member is comprised of a fire resistant polypropylene.

* * * * *